United States Patent
Crippen et al.

(10) Patent No.: US 9,022,434 B2
(45) Date of Patent: May 5, 2015

(54) LATCH FOR SECURING A COMPUTE NODE IN A COMPONENT STORAGE RACK

(75) Inventors: Martin J. Crippen, Apex, NC (US); Anthony F. Katsaros, Youngsville, NC (US); Brian M. Kerrigan, Cary, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 363 days.

(21) Appl. No.: 13/570,459

(22) Filed: Aug. 9, 2012

(65) Prior Publication Data

US 2014/0044480 A1    Feb. 13, 2014

(51) Int. Cl.
E05C 3/02    (2006.01)
H05K 7/14    (2006.01)

(52) U.S. Cl.
CPC ........... H05K 7/1487 (2013.01); *Y10T 403/595* (2015.01)

(58) Field of Classification Search
USPC ........................................................ 292/194
See application file for complete search history.

(56) References Cited

U.S. PATENT DOCUMENTS

| | | | |
|---|---|---|---|
| 5,321,962 A * | 6/1994 | Ferchau et al. | 70/208 |
| 7,023,693 B2 * | 4/2006 | Yuan et al. | 361/679.39 |
| 7,616,450 B2 | 11/2009 | Karstens | |
| 7,684,208 B2 | 3/2010 | Okamoto et al. | |
| 7,782,606 B2 * | 8/2010 | Baker et al. | 361/679.39 |
| 8,023,263 B2 | 9/2011 | Crippen et al. | |
| 8,246,129 B2 * | 8/2012 | Wang et al. | 312/332.1 |
| 8,248,775 B2 * | 8/2012 | Zhang et al. | 361/679.33 |

OTHER PUBLICATIONS

IBM TDB, "Method to Increase Surface Area for Microelectronic Applications", http://www.ip.com/pubview/IPCOM000015477D, Aug. 17, 2002, 7 Pages. (Title Page and pp. 1-6).
"Method for personalized notebook chassis designs", http://www.ip.com/pubview/IPCOM000141646D, Oct. 11, 2006, 6 Pages.

* cited by examiner

*Primary Examiner* — Mark Williams
(74) *Attorney, Agent, or Firm* — Katherine S. Brown; Jeffrey L. Streets

(57) ABSTRACT

A latch selectively secures a compute node enclosure into a chassis bay. The latch comprises a frame securable to a proximal end of the compute node enclosure. A handle is pivotally secured to the frame intermediate a proximal end of the handle and a distal end of the handle so that the handle can be pivoted between a closed position and an open position. A proximal end of a pawl is pivotally coupled at to the distal end of the handle, wherein the pawl includes a landing at a distal end of the pawl and a latch key intermediate proximal and distal ends of the pawl. Movement of the handle positions the pawl into engagement with a slot in chassis bay to assist installation and removal of the compute node enclosure.

13 Claims, 9 Drawing Sheets

LATCH FOR SECURING A COMPUTE NODE IN A COMPONENT STORAGE RACK

BACKGROUND OF THE INVENTION

1. Field of the Invention

The present invention relates to a latch for securing a compute node in a component storage rack.

2. Background of the Related Art

A compute node generally includes electronic data processing and data storage components secured to a circuit board that is disposed within an enclosure. Several compute nodes may be supported in a chassis or rack. Typically, a compute node is adapted for network connection to a host system that communicates data to and from the compute node.

The electronic components of a compute node generate heat that can damage the components if the temperature gets too high. Accordingly, each compute node is generally adapted to fluidically couple to a coolant system that provides a coolant fluid to the compute node enclosure. Non-limiting examples of the coolant system include a fan that draws cool air through the entire enclosure and a cooling liquid loop that circulates water through a heat exchanger in thermal communication with a processor. Where the coolant system involves the use of a liquid, the liquid must be securely contained used mechanical connectors that seal a source conduit to a local conduit that is part of the individual compute node enclosure.

A plurality of compute nodes may be stored in a plurality of bays formed in a chassis or rack. This configuration enables a host computer and/or a coolant system to interface with numerous compute nodes. Each bay of the chassis or rack may include a connector to electronically dock with mating connectors on the compute node when secured within that bay. A compute node interface connector may be disposed at a leading end of a compute node, and the interface connector may plug into a mating connector positioned at the end of the bay.

During compute node installation, the leading end of the compute node is inserted into the mouth of the bay with the mating connector of the compute node aligned with the interface connector within the bay. As the compute node moves further into the bay, the connector on the compute node is coupled to the connector within the bay. The compute node may be secured in this interfaced position using a latch that prevents the compute node from being inadvertently displaced from the interfaced position during use.

BRIEF SUMMARY OF THE INVENTION

One embodiment of the invention provides a latch comprising a frame securable to a proximal end of a compute node enclosure, and a handle pivotally secured to the frame intermediate a proximal end of the handle and a distal end of the handle so that the handle can be pivoted between a closed position and an open position. The latch further comprises a pawl having a proximal end, a distal end, a latch key intermediate the proximal and distal ends, and a landing at the distal end, wherein the proximal end of the pawl is pivotally coupled at to the distal end of the handle. The latch facilitates interfacing of the compute node enclosure in a bay of a chassis by engaging the latch key of the pawl with a proximal end of a slot in a chassis wall that at least partially defines the bay of the chassis as the handle is moved from the open position to the closed position. The latch also facilitates removal of the compute node enclosure from the bay of the chassis by engaging the landing of the pawl with a distal end of the slot in the chassis wall as the handle is moved from the closed position towards the open position.

Another embodiment of the invention is a method comprising the steps of securing a latch to a proximal end of a compute node enclosure, wherein the latch includes a frame, a handle pivotally coupled to the frame at a location on the handle intermediate proximal and distal ends of the handle, and a pawl pivotally coupled to a distal end of the handle, wherein the pawl has a distal end securing a latch key. The method further comprises positioning the handle in an open position to move the pawl within an edge of the frame, inserting the compute node enclosure into a bay of a chassis to position the latch key on the pawl adjacent a slot in the bay, moving the handle from the open position to an intermediate position to displace the latch key on the pawl beyond the edge of the frame and into the slot, and then moving the handle from the intermediate position to a closed position to draw the latch key in a proximal direction to engage a proximal end of the slot to secure the chassis within the bay.

BRIEF DESCRIPTION OF THE APPENDED DRAWINGS

DETAILED DESCRIPTION OF THE INVENTION

Figure 1:
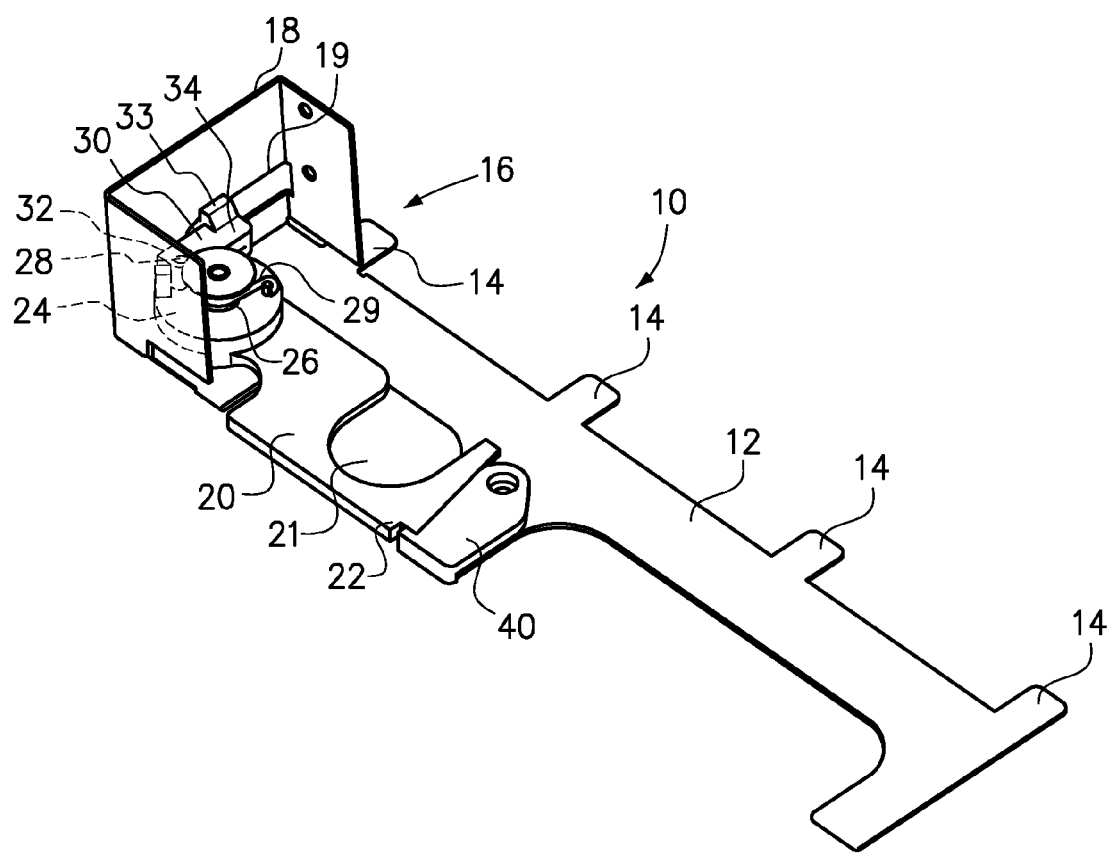
FIG. 1 is a perspective view of one embodiment of a latch in accordance with the present invention.

The present invention provides a latch for securing a component, such as a compute node enclosure, into a component bay of a chassis or rack. Although the invention is described herein in the context of a latch adapted for being connected to a compute node, it should be recognized that the latch may be implemented to secure other hardware components into a bay of a chassis in a similar manner. Embodiments of the latch of the present invention are particularly beneficial for securing a component having one or more external connectors that require fluidic coupling and/or electronic coupling to mating connectors secured within the bay of the chassis. These connectors often require the application of an increased force applied over a short distance and along the axis of the connection to be made up using the latch.

One embodiment of the present invention provides a latch, comprising a frame adapted to be secured to a proximal end of a compute node enclosure, a handle pivotally secured to the frame at a location intermediate a proximal end and a distal end of the handle, and a pawl pivotally secured at a proximal end to the distal end of the handle. The pawl has a latch key formed intermediate a distal end and the proximal end connection to the handle.

Pivoting of the handle relative to the frame from an open position to an intermediate position deploys the latch key beyond an edge of the frame to engage a slot in a side of the bay in which the compute is to be installed. Further pivotal movement of the handle from the intermediate position to closed position draws the latch key in a proximal direction within the slot to engage and then bear against the proximal end of the slot. A reactive force is produced at the pivotal coupling between the handle and the frame to move the latch and the compute node connected thereto to an interfaced position within the bay. In a chassis having fluidic and/or electronic connectors aligned with connectors on the compute node, the movement of the compute node to the interfaced position causes the mating connectors to engage one with the other.

Embodiments of the latch also assist in the removal of the compute node from the interfaced position within a bay of a component storage rack. Pivoting the handle from the closed position to an intermediate position moves the latch key off the proximal end of the slot and then engages a landing on the distal end of the pawl with a distal end of the slot in the chassis wall. The slot in the chassis wall may be provided by a slot in a side rail secured in the chassis. Further pivoting of the handle from the intermediate position to the open position moves the landing on the pawl against the distal end of the slot to produce a reactive force on the frame at the pivotal coupling between the handle and the frame. The reactive force on the frame is transferred to the connected compute node to move the compute node from the interfaced position within the bay of the component storage rack. In a chassis having fluidic and/or electronic connectors mated with connectors on the compute node, the movement of the compute node from the interfaced position disengages the connectors.

One embodiment of the latch of the present invention comprises a spring element to bias the pawl about the pivotal coupling formed between the proximal end of the pawl and the distal end of the handle, wherein the pawl is biased towards an adjacent edge of the frame of the latch. The spring element will dispose the latch key on the pawl into engagement with the slot in a chassis wall when the handle is rotated from an open position towards a closed position. The pawl preferably includes a physical feature, such as a stop element, that allows only the latch key and landing to extend through a slot in the side of the frame. Optionally, the spring element may be a torsion spring that is secured to the handle.

Another embodiment of the latch of the present invention comprises a spring element to bias the handle of the latch about the pivotal coupling between the handle and the frame, such that the handle is biased toward the open position. This embodiment may include a keeper to secure the handle in the closed position and prevent the spring element from opening the handle when the compute node is in the interfaced position within the bay of the component storage rack.

Another embodiment of the invention provides a method for securing a compute node enclosure in a bay of a chassis or electronic component storage rack. The method comprises the steps of securing a latch to a proximal end of a compute node enclosure, wherein the latch includes a frame, a handle pivotally coupled to the frame at a location on the handle intermediate proximal and distal ends of the handle, and a pawl pivotally coupled to a distal end of the handle, wherein the pawl has a distal end securing a latch key. The method further comprises positioning the handle in an open position to move the pawl within an edge of the frame, inserting the compute node enclosure into a bay of a chassis to position the latch key on the pawl adjacent a slot in the bay, moving the handle from the open position to an intermediate position to displace the latch key on the pawl beyond the edge of the frame and into the slot, and then moving the handle from the intermediate position to a closed position to draw the latch key in a proximal direction to engage a proximal end of the slot to secure the chassis within the bay.

In one embodiment of the method, the reactive force imparted to the compute node enclosure by the latch inserts a pluggable connector on the compute node enclosure with a mating pluggable connector secured to the chassis at the distal end of the bay into which the compute node is being installed. Optionally, the handle may be locked in the closed position using a keeper.

It should be appreciated that various embodiments of the invention provide a latch that facilitates leveraged insertion of the compute node enclosure to an interfaced position within the bay without the necessity of consuming any lateral space beyond the width of the chassis. Embodiments of the latch may also facilitate leveraged dislodgement of the compute node and chassis from the interfaced position within the bay.

FIG. 1 is a perspective view of one embodiment of a latch 10 of the present invention. The latch 10 comprises a frame 12 having a plurality of tabs 14 extending therefrom to couple the latch 10 to an enclosure (see FIG. 2). The tabs may be designed to attach with an enclosure temporarily, such as with screws, or more permanently, such as with rivots or by welding. The frame 12 comprises an end 16 with a wall 18 extending longitudinally along a portion of the end 16 of the frame 12. The latch 10 further comprises a handle 20 having a finger groove 21, a proximal end 22 and a distal end 24, with the handle 20 pivotally coupled to the frame 12 at a first pivot 26 intermediate the proximal end 22 and the distal end 24 of the handle 20. The handle 20 further comprises a second pivot 28 at the distal end 24 of the handle 20, and a pawl 30 having a proximal end 32 pivotally coupled to the second pivot 28. The pawl 30 further comprises a distal end 34 having a landing (See landing 36 in FIG. 6), a latch key (See latch key 38 in FIG. 6) intermediate the distal end 34 and the proximal end 32 of the pawl 30, and a stop element 33 that allows only the latch key and landing to extend through the slot 19 in the wall 18. A torsion spring 29 is disposed to bias the pawl 30 outwardly toward the slot 19, as will be described further below.

FIG. 1 further illustrates the use of a keeper 40 pivotally coupled to the frame 12 and having a locked position to prevent movement of the handle 20 from the closed position shown in FIG. 1. The keeper 40 may be pivoted away from the handle to release the handle 20 and allow movement of the handle 20 from the closed position towards an open position (shown in FIG. 4).

Figure 2:
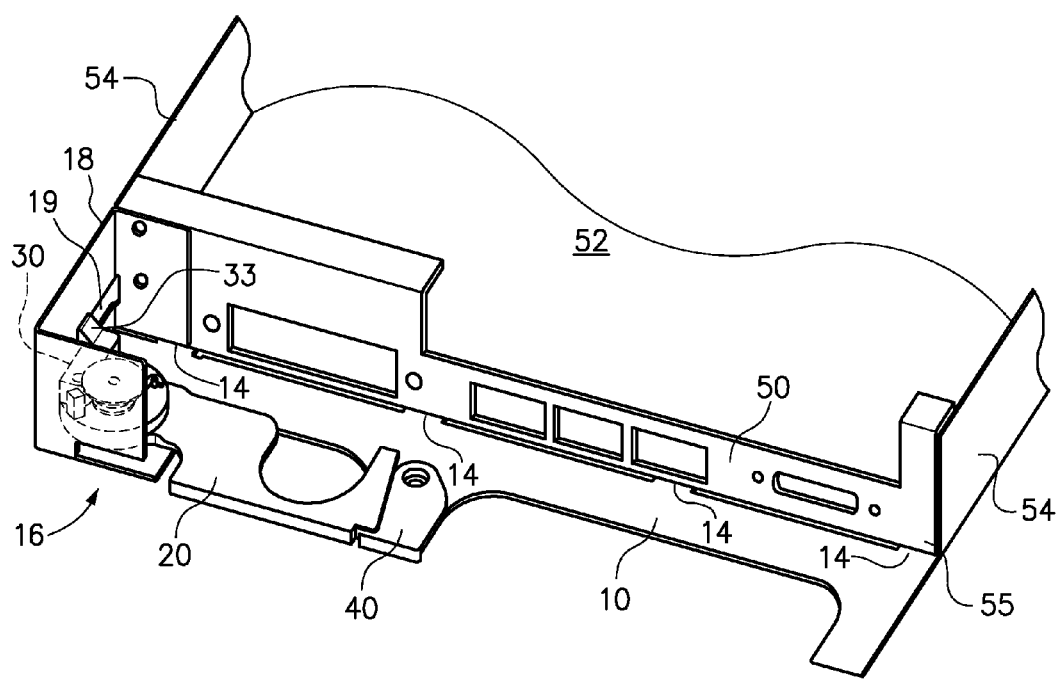
FIG. 2 is a perspective view of the latch connected to a compute node enclosure.

FIG. 2 is a perspective view of the latch 10 of FIG. 1 connected through the tabs 14 to a compute node enclosure 50 for supporting a compute node (not shown). The enclosure 50 comprises a bed 52 between two sides 54 to receive and position a circuit board to be supported by the enclosure 50 within a bay of a chassis. When the enclosure is fully received in the bay, the compute node is interfaced with, for example, a backplane (not shown) and/or a coolant circuit (not shown). The chassis may comprise electrical and/or fluidic connectors that engage mating connectors on the enclosure to provide electronic communication with a backplane or fluidic communication with a coolant circuit.

FIG. 2 illustrates the latch 10 connected to a proximal end 55 of the chassis enclosure 50. The handle 20 and pawl 30 of the latch 10 are located at an end 16 of the latch 10 to dispose the pawl 30 adjacent a slot (see FIG. 3) in a side of a chassis when the latch 10 is connected to the enclosure 50, and the latch 10 and enclosure 50 are installed in a chassis. The handle 20 is illustrated as secured in the closed position using the keeper 40.

Figure 3:
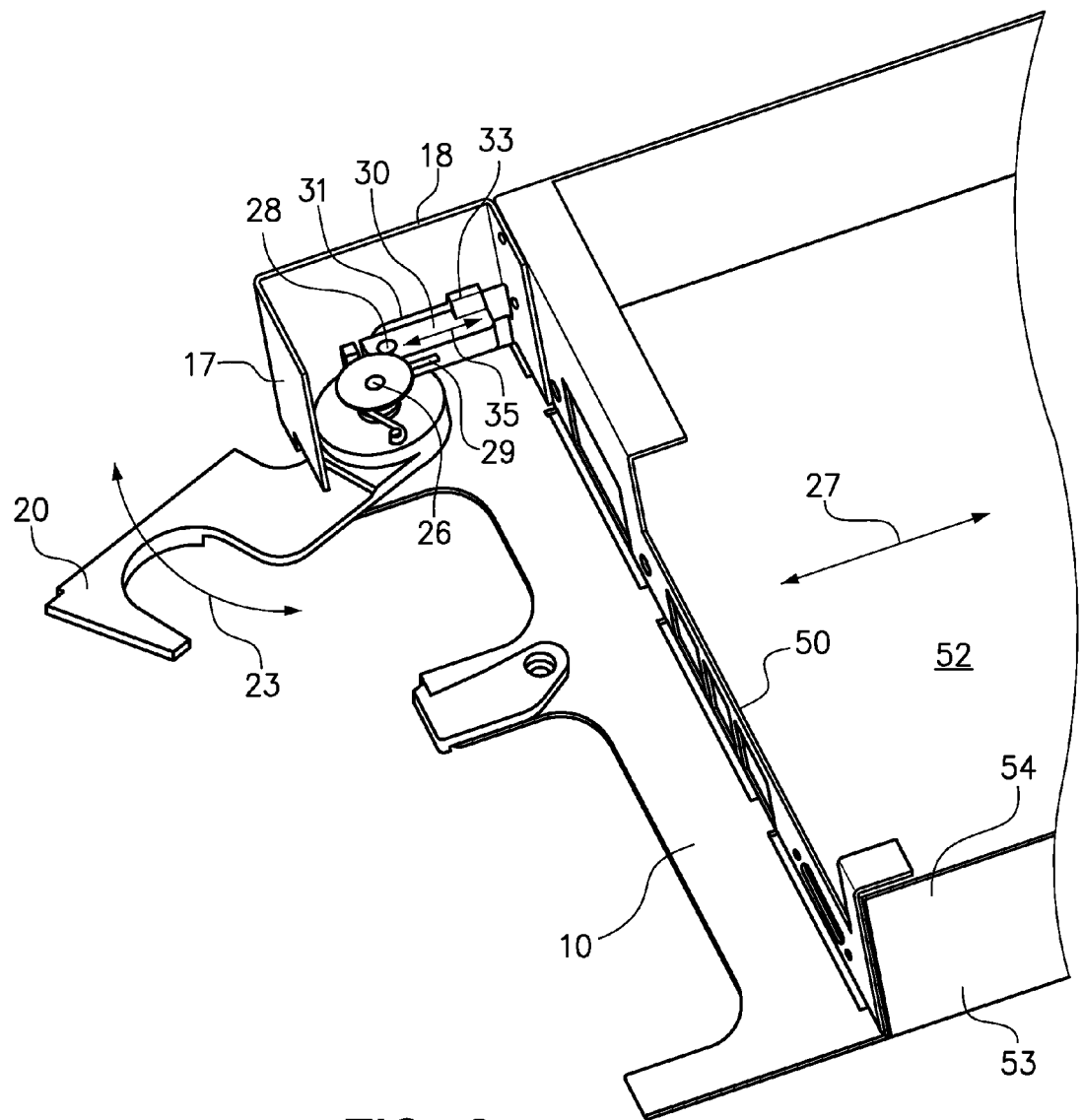
FIG. 3 is a perspective view of the latch and the enclosure illustrating how movement of the handle results in movement of a pawl and the enclosure.

FIG. 3 is a perspective view of the latch 10 and chassis enclosure 50 of FIG. 2 showing that rotation of the handle 20 about the first pivot 26 (see arrow 23) results in generally back and forth movement of the pawl 30 (see arrow 35) in a slot 31 in the wall 18. When the pawl 30 engages a slot in a chassis wall (not shown), this results in insertion and removal of the enclosure 50 (see arrow 27). Pivoting of the handle 20 about the first pivot 26 toward a closed position moves the second pivot 28 and the pawl 30 coupled thereto in a proximal direction towards the proximal end 17 of the latch 10 and moves the latch key 38 (not shown) towards the proximal end of the slot 31.

Figure 4:
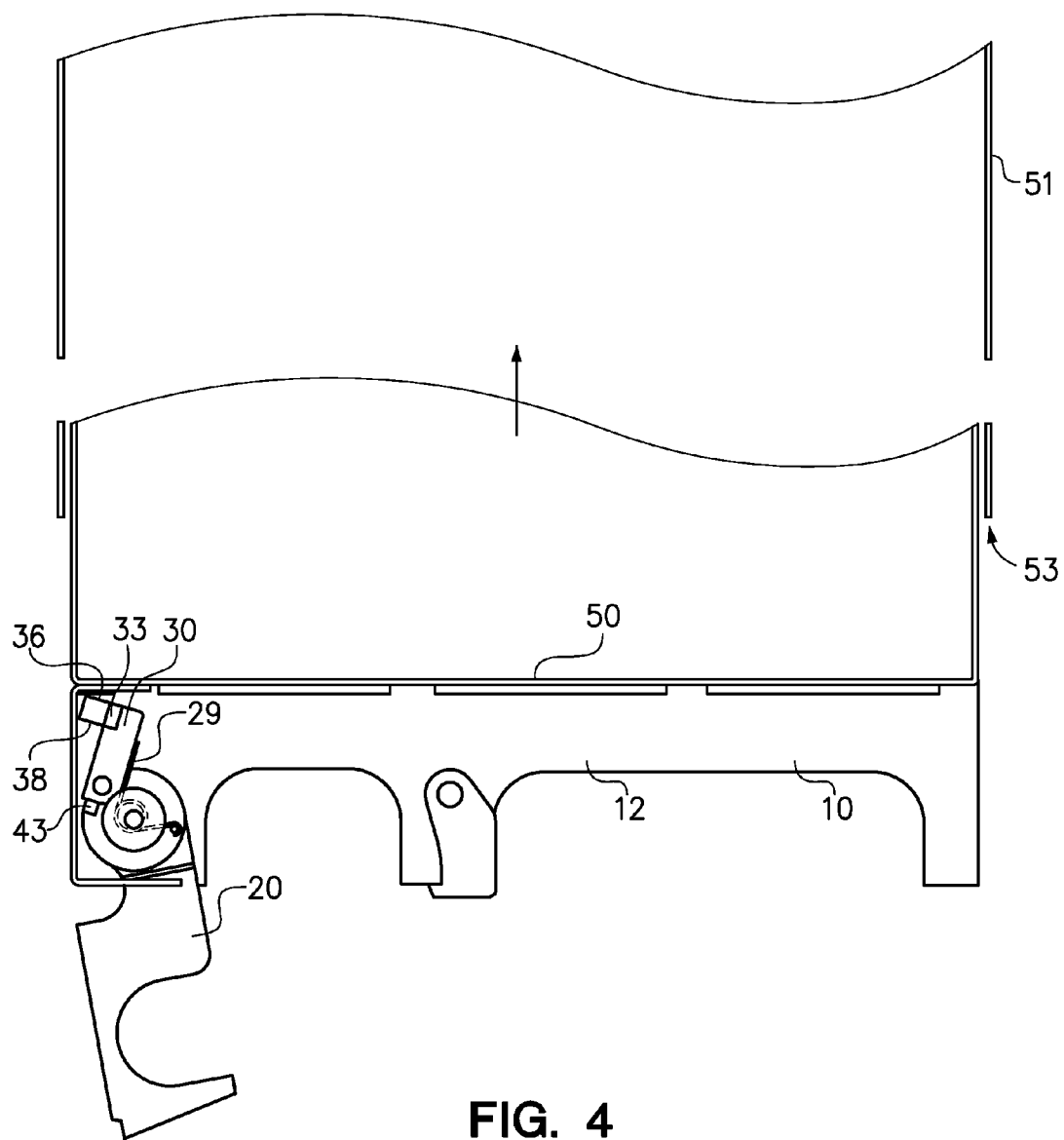
FIG. 4 is a plan view of the latch and the enclosure being introduced into a chassis bay.

FIG. 4 is a plan view of the latch 10 and the enclosure 50 as the latch and enclosure are being positioned into a bay 53 of a chassis 51. With the handle 20 in the open position shown, the latch key 38 of the pawl 30 is fully retracted inside the frame 12 so as not to interfere with insertion of the enclosure 50 and latch 10 into the chassis 51. Although the pawl 30 is bias outwardly (left in FIG. 4) by the spring 29, the fully open position of the handle 20 disposes the stop element 43 against the proximal end of the pawl 30, thereby retracting the pawl 30 so that even the latch key 38 and landing 36 do not extend outside the boundaries of the frame 12.

Figure 5:
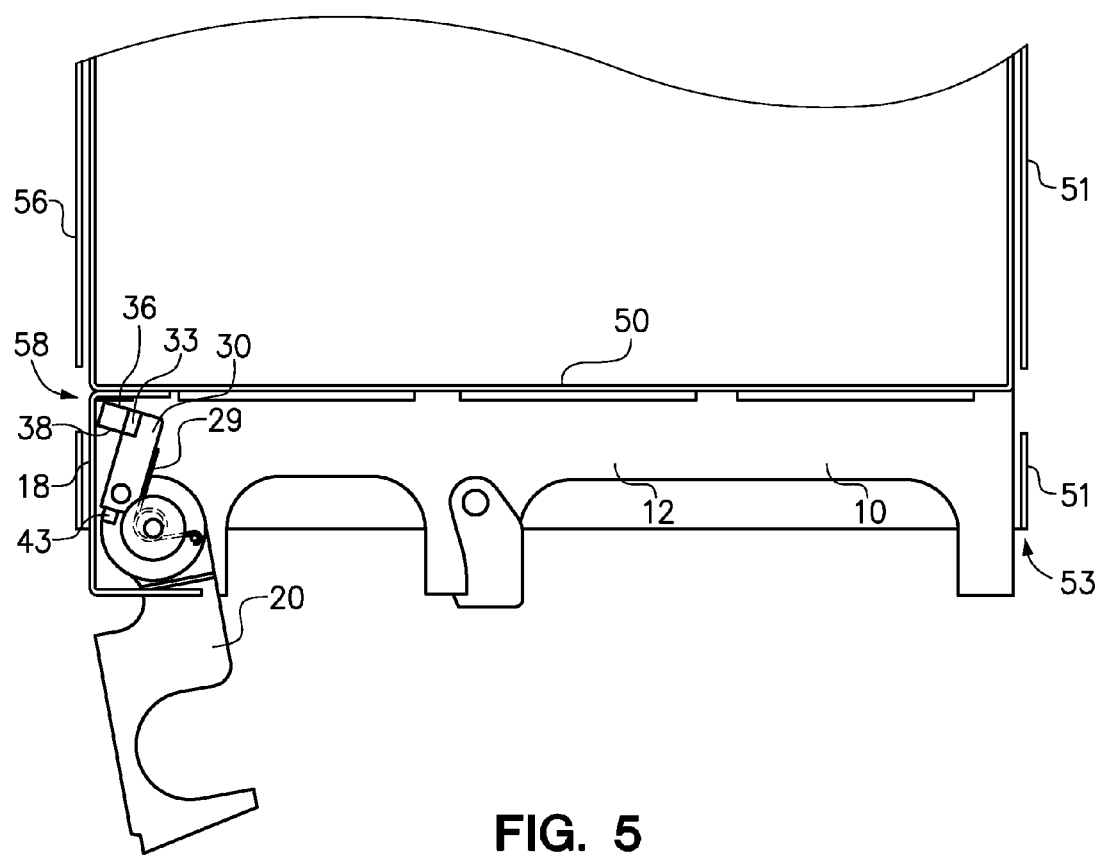
FIG. 5 is the plan view of the latch and the enclosure positioned in the chassis bay with the pawl aligned with a slot in the chassis wall.

FIG. 5 is a plan view of the latch 10 and the enclosure 50 positioned in the bay of a chassis 51. The latch key 38 of the pawl 30 is still fully retracted inside the frame 12, but the latch key 38 is now aligned with the slot 58 in the side of the chassis 51. In this position, the connectors on the leading end of the compute node enclosure 50 are in contact with the connectors in the back of the bay 53, but the connectors are not yet coupled. The slot (see slot 17 in FIG. 1) in the wall 18 is not shown in this view, but is still present for allowing the latch key 38 of the pawl 30 to extend therethrough.

Figure 6:
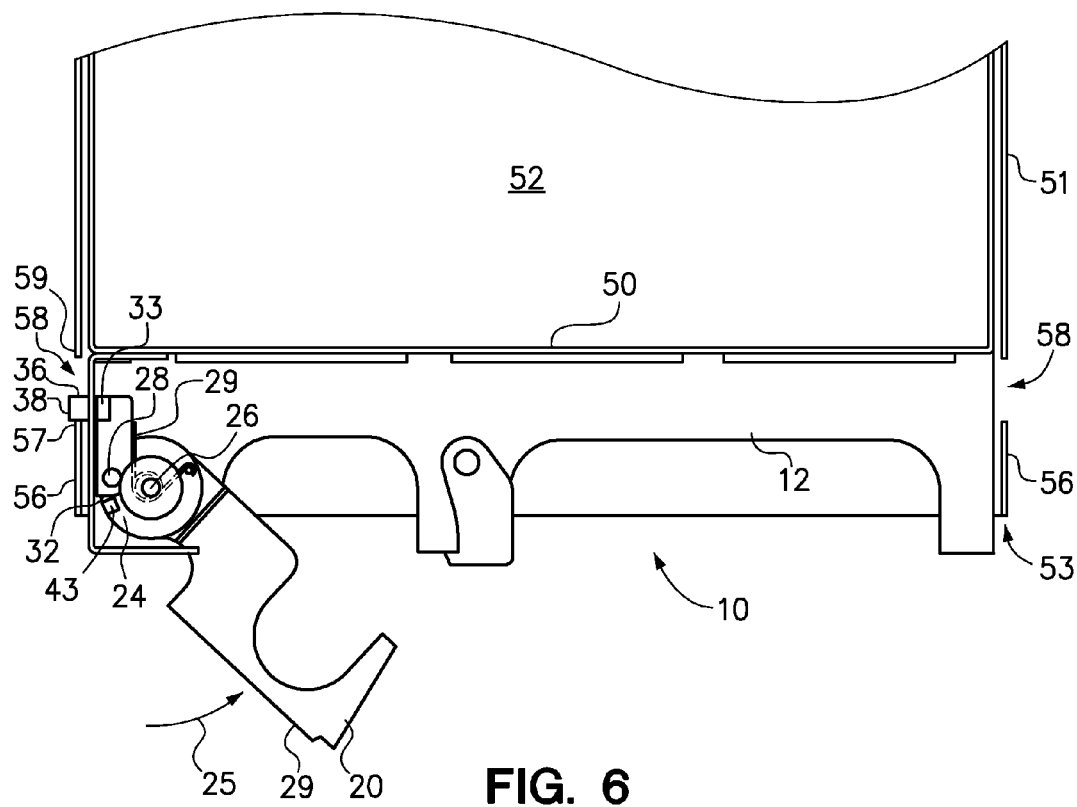
FIG. 6 is the plan view of the latch key engaging the slot after the handle has been rotated from an open position to an intermediate position.

FIG. 6 is a plan view of the latch 10 and the enclosure 50 positioned in the bay 53 of a chassis 51 after the handle 20 has been moved as shown by the arrow 25 from the open position (FIG. 5) to an intermediate position. In the intermediate position, the latch key 38 has rotated outwardly into the chassis slot 58 to engage the proximal end 57 of the slot 58. This outward rotation of the latch key 38 is the result of the spring 29 biasing the pawl outwardly and the stop element 43 moving out of the way. Also, the stop element 33 rides up against the inside of the wall 18 to limit how much of the pawl can extend through the slot (see slot 17 in FIG. 1).

Further pivoting of the handle 20 from the intermediate position toward a closed position (See FIG. 7), by pushing a surface 29 on the proximal end of the handle 20, will impart a leveraged force through the distal end 24 of the handle 20 to the proximal end 32 of the pawl 30 to pull the latch key 38 forward against the towards the proximal end 57 of the slot 58. This movement of the latch key draws the enclosure 50 further into the bay 53.

Figure 7:
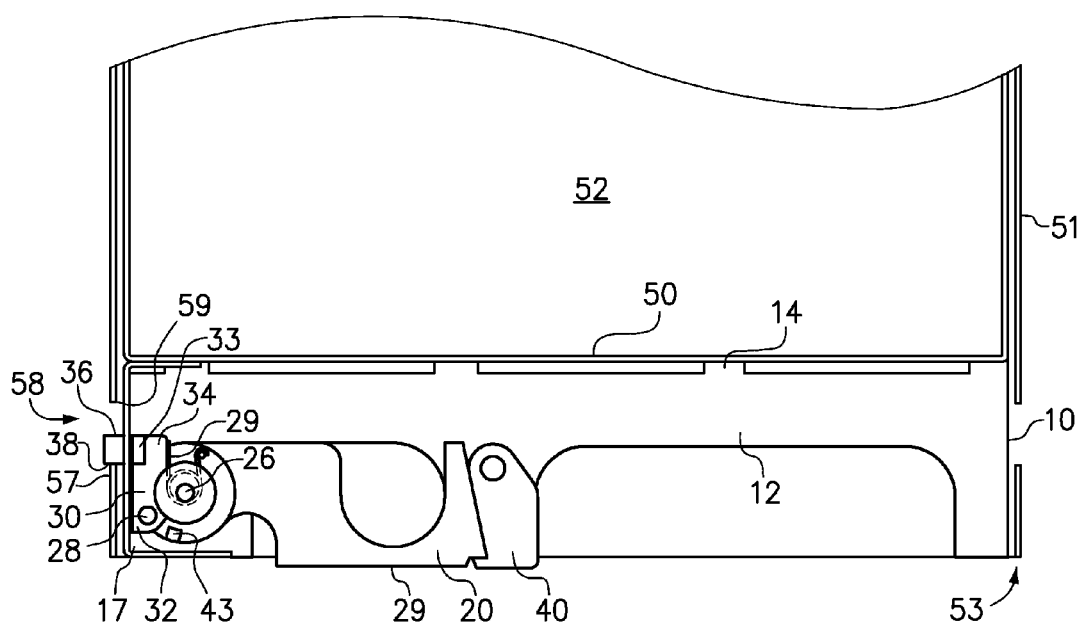
FIG. 7 is a plan view of the latch and the enclosure secured in docked position within a bay of a component storage rack.

FIG. 7 is a plan view of the latch 10 and enclosure 50 secured in an interfaced position within a bay 53 of a chassis 51. The handle 20 is in the closed position and secured by the latch keeper 40. The latch key 38 of the pawl 30 extends through the slot in the wall 18 and is received in the slot 58, imparting a force against the proximal end 57 of the slot 58. This force on the slot 58 produces a reactive force on the frame 12 at the first pivot 26. The reactive force on the frame 12 transfers to the connected enclosure 50 to move the enclosure 50 relative to the sides 51 of the chassis until the compute node enclosure is in an interfaced position within the bay 53.

Figure 8:
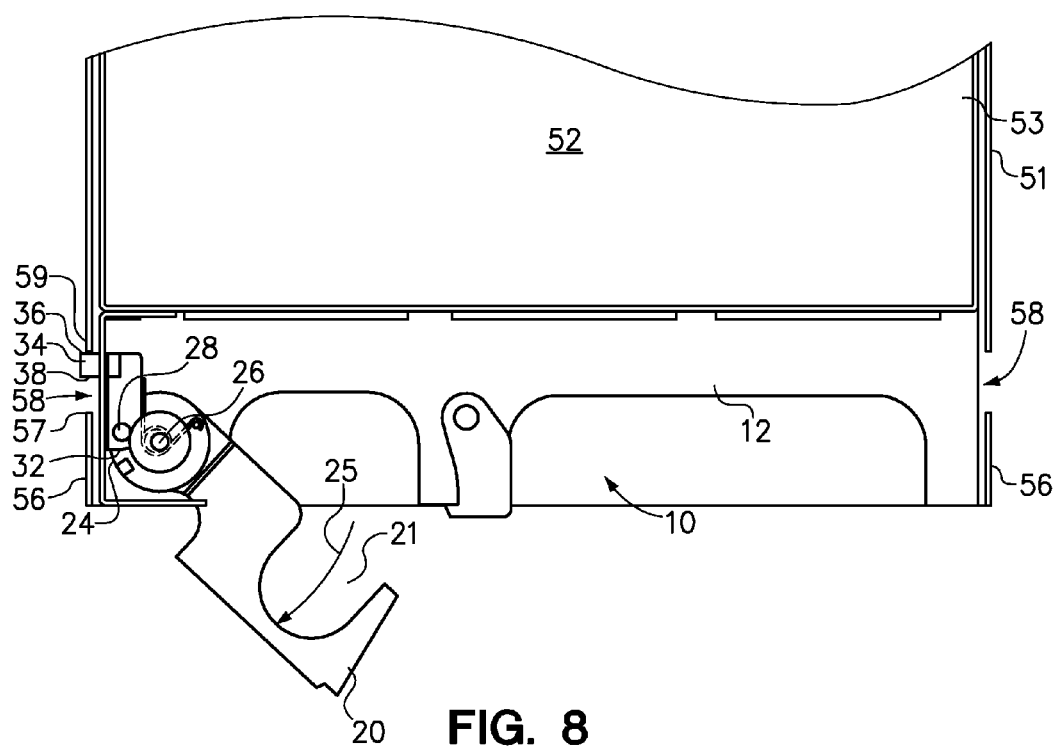
FIG. 8 is a plan view of the embodiment of the latch after the handle 20 is pivoted from the closed position to an intermediate position.

FIG. 8 is a plan view of the embodiment of the latch 10 after the handle 20 is pivoted from the closed position (see FIG. 7) and in the direction of arrow 25 to an intermediate position. This is the first step in releasing the latch and removing the compute node enclosure 50 from the bay 53. As the handle 20 is initially pivoted from the closed position, the latch key 38 on the pawl 30 disengages the proximal end 57 of the slot 58 in chassis bay 53. Further pivoting of the handle 20 to the intermediate position illustrated in FIG. 8 moves the latch key 38 on the pawl 30 in a distal direction along the slot 58 until a landing 36 on the distal end 34 of the pawl 30 engages the distal end 59 of the slot 58. Further pivoting of the handle 20 from the position illustrated in FIG. 8 will apply, through the landing 36 on the pawl 30, a leveraged force against the distal end 59 of the slot 58 to produce a reactive force applied to the frame 12 at the first pivot 26 to displace the connected chassis enclosure 50 from the interfaced position within the bay 53 of the chassis 51.

Figure 9:
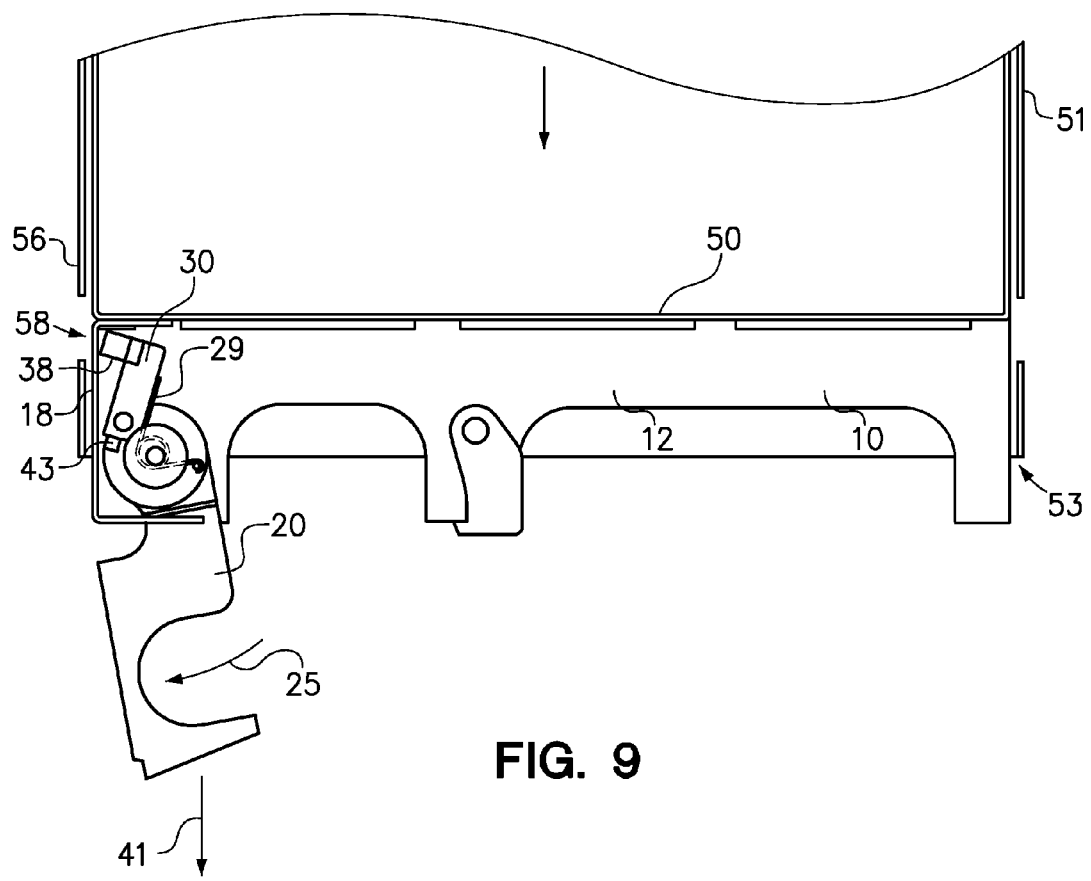
FIG. 9 is a plan view of the latch and enclosure after the handle 20 is rotated further to the open position to withdraw the pawl from the slot.

FIG. 9 is a plan view of the latch 10 and enclosure 50 after the handle 20 is rotated further in the direction of arrow 25 to the open position to withdraw the latch key 38 from the slot 58 in the side 56 of the chassis 51, such that the pawl 30 is in a position within the wall 18 of the latch 10. As stated previously, the pawl is still outwardly biased by the spring 29, but the stop element 43 has rotated into contact with the proximal end of the pawl so as to oppose the spring force and retract the pawl. In this configuration, the latch 10 is disengaged from the chassis side 56 and the compute node enclosure 50 can be slidably removed from the bay 53 by pulling the handle 20 in the direction of the arrow 41.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A latch for securing a compute node enclosure in a bay of a chassis, comprising:
   a frame securable to a proximal end of a compute node enclosure;
   a handle pivotally secured to the frame intermediate a proximal end of the handle and a distal end of the handle so that the handle can be pivoted between a closed position and an open position;
   a pawl having a proximal end, a distal end, a latch key intermediate the proximal and distal ends, and a landing at the distal end, wherein the proximal end of the pawl is pivotally coupled to the distal end of the handle, wherein the latch key extends laterally from the pawl and forms a proximally directed surface, and wherein the landing extends laterally from the pawl and forms a distally directed surface;

a spring element coupled between the handle and the pawl to bias the pawl towards an edge of the frame; and a stop element on the handle that retracts the pawl in response to the handle being rotated to the open position;

wherein the latch facilitates interfacing of the compute node enclosure in a bay of a chassis by engaging the latch key of the pawl with a proximal end of a slot in a chassis wall that at least partially defines the bay of the chassis as the handle is moved from the open position to the closed position; and wherein the latch facilitates removal of the compute node enclosure from the bay of the chassis by engaging the landing of the pawl with a distal end of the slot in the chassis wall as the handle is moved from the closed position towards the open position.

2. The latch of claim 1, wherein pivotal movement of the handle from the open position to an intermediate position deploys the latch key beyond a lateral edge of the frame to align with the proximal end of the slot in the chassis wall.

3. The latch of claim 2, wherein pivotal movement of the handle from the intermediate position to the closed position engages the latch key on the pawl with the proximal end of the slot in the chassis wall and then draws the latch key in a proximal direction to move the compute node enclosure to a fully interfaced position with a compute node connector coupled to a chassis bay connector.

4. The latch of claim 1, wherein pivotal movement of the handle from the closed position to an intermediate position moves the latch key in a distal direction to disengage from the proximal end of the slot in the chassis wall and then engages the landing on the pawl with the distal end of the slot in the chassis wall.

5. The latch apparatus of claim 4, wherein further pivotal movement of the handle from the intermediate position to the open position displaces the distal end of the slot in the chassis wall in a distal direction relative to the latch to disengage the compute node enclosure from the fully interfaced position.

6. The latch of claim 1, wherein the pawl is pivotally coupled to the distal end of the handle by a pin on one of the pawl and the handle received in a hole on the other of the pawl and handle, wherein the pin establishes a pivot axis about which the pawl is able to pivot relative to the handle.

7. The latch of claim 1, wherein the landing on the pawl is shaped to seat against the distal end of the slot in the chassis wall.

8. The latch of claim 1, wherein the pivot coupling between the pawl and the handle is spring-biased to pivot the pawl towards the slot in the chassis wall.

9. The latch of claim 1, further comprising:
a spring element to bias the handle relative to the frame and toward the open position.

10. The latch apparatus of claim 1, further comprising:
a keeper pivotally secured to the frame to selectively secure the handle in the closed position.

11. The latch apparatus of claim 1, wherein the spring element is a torsion spring.

12. The latch apparatus of claim 1, wherein the pawl is pivotally coupled only to the distal end of the handle.

13. The latch apparatus of claim 1, further comprising:
a stop element on the pawl that allows only the latch key and landing to extend through the slot.

* * * * *